United States Patent
Direcks et al.

(10) Patent No.: US 9,618,835 B2
(45) Date of Patent: Apr. 11, 2017

(54) LITHOGRAPHIC APPARATUS AND A DEVICE MANUFACTURING METHOD INVOLVING AN ELONGATE LIQUID SUPPLY OPENING OR AN ELONGATE REGION OF RELATIVELY HIGH PRESSURE

(75) Inventors: Daniel Jozef Maria Direcks, Simpelveld (NL); Erik Henricus Egidius Catharina Eummelen, Eindhoven (NL); Clemens Johannes Gerardus Van Den Dungen, Someren (NL); Maikel Adrianus Cornelis Schepers, Nuenen (NL); Sergei Shulepov, Eindhoven (NL); Pieter Mulder, Duizel (NL); David Bessems, Eindhoven (NL); Marco Baragona, Delft (NL)

(73) Assignee: ASML NETHERLANDS B.V., Veldhoven (NL)

(*) Notice: Subject to any disclaimer, the term of this patent is extended or adjusted under 35 U.S.C. 154(b) by 701 days.

(21) Appl. No.: 13/017,700

(22) Filed: Jan. 31, 2011

(65) Prior Publication Data
US 2011/0188012 A1    Aug. 4, 2011

Related U.S. Application Data

(60) Provisional application No. 61/300,609, filed on Feb. 2, 2010, provisional application No. 61/332,030, filed on May 6, 2010.

(51) Int. Cl.
    *G03B 27/52* (2006.01)
(52) U.S. Cl.
    CPC ................ *G03B 27/52* (2013.01)

(58) Field of Classification Search
    CPC .................................. G03F 7/70341
    USPC ........................................... 355/30
    See application file for complete search history.

(56) References Cited

U.S. PATENT DOCUMENTS

| 4,509,852 A | 4/1985 | Tabarelli et al. |
| 7,428,038 B2 | 9/2008 | Verhagen et al. |
| 2004/0136494 A1 | 7/2004 | Lof et al. |
| 2004/0207824 A1 | 10/2004 | Lof et al. |
| 2004/0263809 A1 | 12/2004 | Nakano |
| 2005/0018155 A1 | 1/2005 | Cox et al. |

(Continued)

FOREIGN PATENT DOCUMENTS

| EP | 1420300 | 5/2004 |
| JP | 2005-223315 | 8/2005 |

(Continued)

OTHER PUBLICATIONS

Japanese Office Action mailed Jul. 2, 2012 in corresponding Japanese Patent Application No. 2011-014673.
Dimitrakopoulos and Higdon, "On the displacement of three-dimensional fluid droplets from solid surfaces in low-Reynolds-number shear flows," Journal of Fluid Mechanics, vol. 377, pp. 189-222 (1998).

*Primary Examiner* — Chia-How Michael Liu
(74) *Attorney, Agent, or Firm* — Pillsbury Winthrop Shaw Pittman LLP

(57) ABSTRACT

In a liquid confinement structure of an immersion lithographic apparatus an elongate continuous opening forms an outlet for supplying liquid to a space beneath the projection system. The elongate slit forms a region of high shear and pressure gradient that deflects bubbles away from the image field.

20 Claims, 6 Drawing Sheets

(56) References Cited

U.S. PATENT DOCUMENTS

| | | |
|---|---|---|
| 2006/0038968 A1 | 2/2006 | Kemper et al. |
| 2006/0119809 A1 | 6/2006 | Verhagen et al. |
| 2006/0119818 A1 | 6/2006 | Nagasaka |
| 2006/0192929 A1 | 8/2006 | Verhagen et al. |
| 2006/0209414 A1 | 9/2006 | Van Santen et al. |
| 2006/0231206 A1 | 10/2006 | Nagasaka et al. |
| 2007/0243329 A1 | 10/2007 | De Graaf |
| 2008/0007704 A1 | 1/2008 | Leenders et al. |
| 2008/0212046 A1 | 9/2008 | Riepen et al. |
| 2008/0212056 A1* | 9/2008 | Shiraishi .................. 355/53 |
| 2009/0268175 A1 | 10/2009 | Chibana et al. |
| 2009/0279060 A1 | 11/2009 | Direcks et al. |
| 2009/0279062 A1 | 11/2009 | Direcks et al. |
| 2010/0060868 A1* | 3/2010 | Tanasa et al. .................. 355/30 |
| 2010/0313974 A1 | 12/2010 | Riepen et al. |
| 2011/0013158 A1 | 1/2011 | Philips et al. |

FOREIGN PATENT DOCUMENTS

| | | |
|---|---|---|
| JP | 2006-245573 | 9/2006 |
| JP | 2006-295151 | 10/2006 |
| JP | 2007-109740 | 4/2007 |
| JP | 2007-201384 | 8/2007 |
| JP | 2007-281308 | 10/2007 |
| JP | 2008-010893 | 1/2008 |
| JP | 2009-267235 | 11/2009 |
| JP | 2009-272635 | 11/2009 |
| WO | 99/49504 | 9/1999 |
| WO | 2005/048328 | 5/2005 |
| WO | 2005/064405 | 7/2005 |
| WO | 2008/029852 | 3/2008 |

* cited by examiner

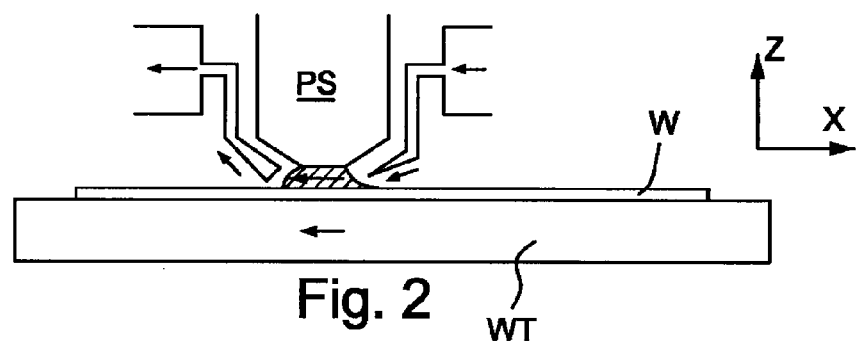
Fig. 2
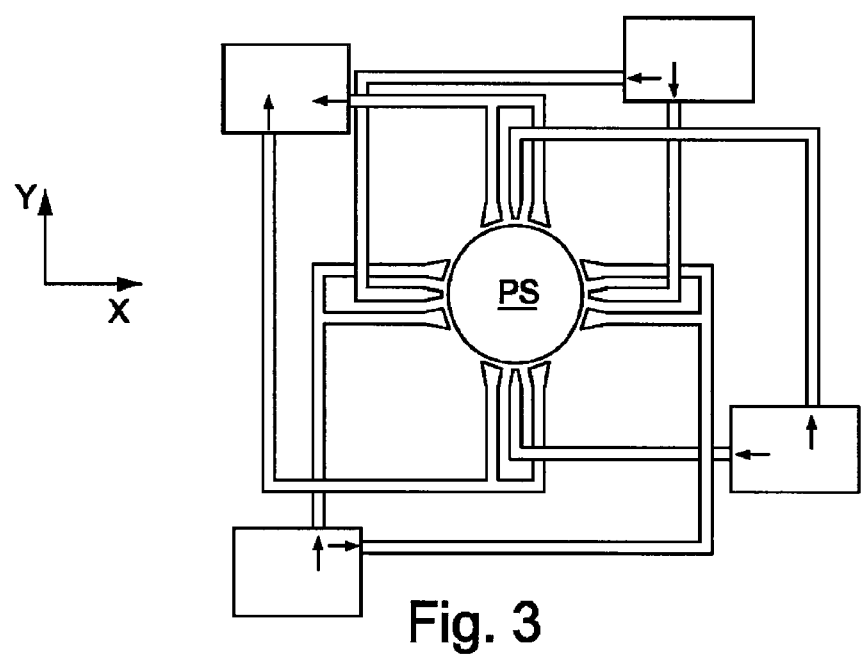
Fig. 3
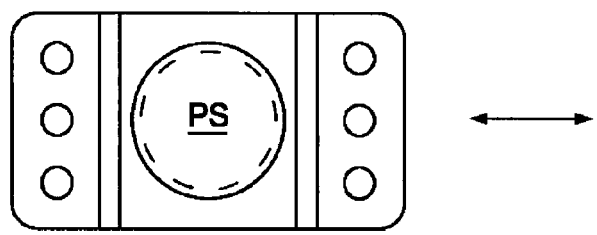
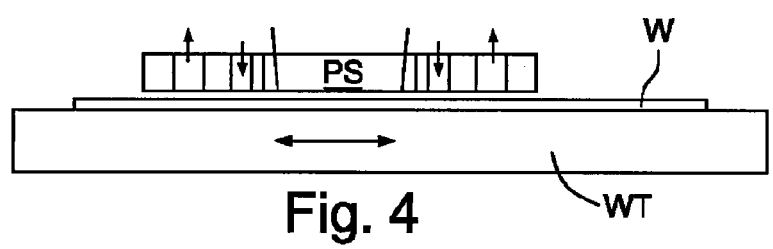
Fig. 4

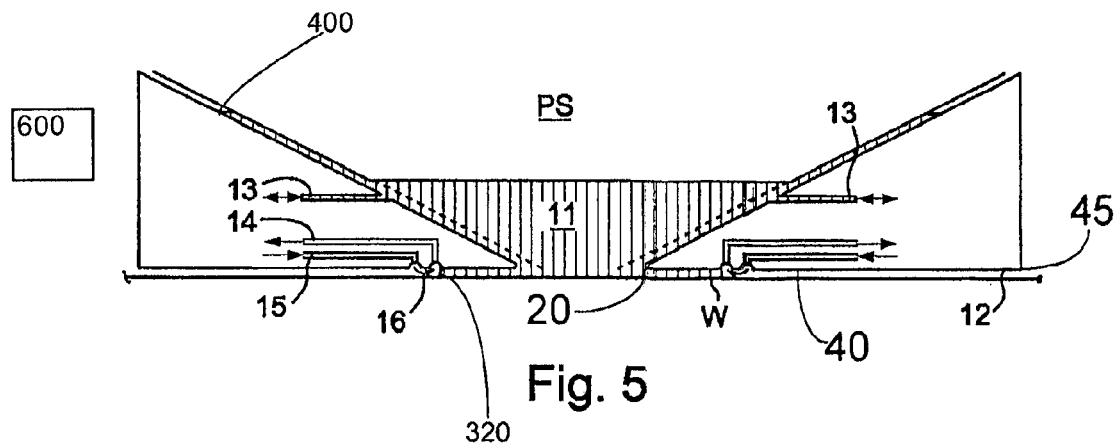
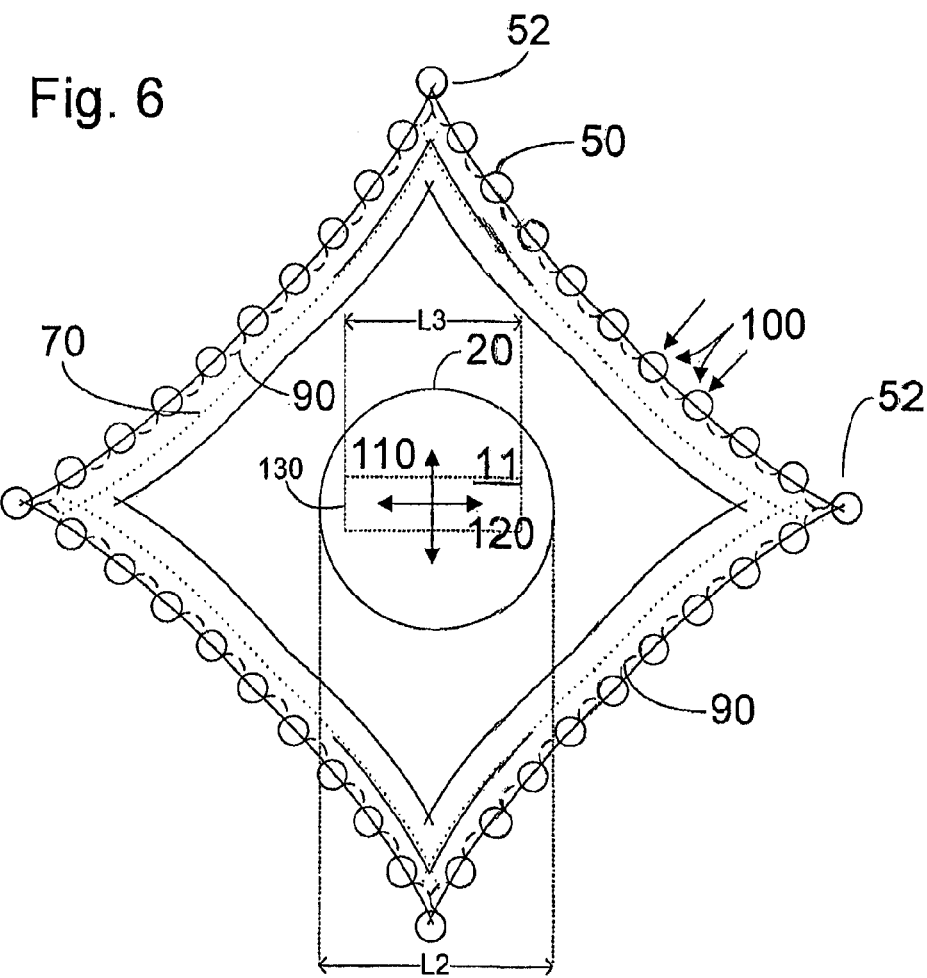

LITHOGRAPHIC APPARATUS AND A DEVICE MANUFACTURING METHOD INVOLVING AN ELONGATE LIQUID SUPPLY OPENING OR AN ELONGATE REGION OF RELATIVELY HIGH PRESSURE

This application claims priority and benefit under 35 U.S.C. §119(e) to U.S. Provisional Patent Application No. 61/300,609, entitled "Lithographic Apparatus and a Device Manufacturing Method", filed on Feb. 2, 2010 and U.S. Provisional Patent Application No. 61/332,030, entitled "Lithographic Apparatus and a Device Manufacturing Method", filed on May 6, 2010. The content of those applications is incorporated herein in their entirety by reference.

FIELD

The present invention relates to a lithographic apparatus, a liquid confinement system and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with at least one table, in an embodiment two tables, for supporting a substrate. In an embodiment, leveling measurements are carried out with a table at a first position, without immersion liquid, and exposure is carried out with a table at a second position, where immersion liquid is present. In another embodiment, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, for example ASML's "Twinscan®" lithographic apparatus, the swap of the substrate tables takes place under the projection system.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

PCT patent application publication WO 2005/064405 discloses another type of immersion system arrangement referred to the all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A liquid controller at the edge of a substrate table, such as a barrier, prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system which may comprise a fluid confinement member. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. The fluid handling system may be located between the projection system and a table such as a substrate table. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

In a fluid handling system or liquid confinement structure, liquid is confined to a space i.e. in an immersion space. For example within a confinement structure the liquid is confined by the body of the structure, the surface of the projection system and the underlying surface (e.g. a substrate table, a substrate supported on the substrate table, a shutter member and/or a measurement table). In the case of a localized area immersion system, the liquid is in part confined in the immersion space by a liquid meniscus between the fluid handling system or liquid confinement structure and the underlying structure. In the case of an all wet system, liquid is allowed to flow out of the immersion space onto the top surface of the substrate and/or substrate table.

In an immersion lithography apparatus, if a bubble passes through the projection beam during imaging, an imaging defect can be formed. A defect caused by a bubble can be serious, resulting in the formation of a defective device, particularly if the bubble is sufficiently large to affect more than one imaged device.

SUMMARY

It is desirable to provide a lithographic apparatus in which a bubble is prevented from entering the projection beam during imaging.

In an aspect, there is provided a lithographic apparatus comprising a substrate table arranged to hold a substrate and scan the substrate in a scanning direction; a projection system arranged to project an image onto the substrate while the substrate is scanned by the substrate table; and a liquid confinement system arranged to confine a liquid to a space between the projection system and the substrate, wherein the projection system has an optical axis and is arranged to project the image into an image field having a maximum dimension, in a direction perpendicular to the optical axis and the scanning direction, that is smaller than a maximum dimension of the space in the direction; and the liquid confinement system has a liquid confinement member bordering the space, the liquid confinement member defining a continuous, elongate liquid supply opening arranged to direct liquid toward the substrate, the elongate liquid supply opening having a dimension in the direction that is greater than the maximum dimension of the image field and less than the maximum dimension of the space.

In an aspect, there is provided an immersion lithographic apparatus to project an image onto a substrate through a body of liquid confined on a surface of the substrate by a liquid confinement system, while the substrate is scanned in a scanning direction, wherein the liquid confinement system has an elongate liquid supply opening arranged to create a region of relatively high pressure in the body of liquid so as to direct bubbles of gas in the liquid away from the image.

In an aspect, there is provided a device manufacturing method using a lithographic apparatus, the method comprising: confining a body of liquid to a space in contact with the surface of a substrate; projecting an image onto the substrate through the body of liquid while moving the substrate in a scanning direction; forming an elongate region of relatively high pressure in the body of liquid ahead of the image in the scanning direction whereby the region of relatively high pressure is effective to divert bubbles of gas in the body of liquid away from the image.

In an aspect, there is provided an immersion lithographic apparatus to project an image onto a substrate through a body of liquid confined on a surface of the substrate by a liquid confinement system, while the substrate is scanned in a scanning direction, wherein the liquid confinement system has a liquid confinement member that has at least one corner aligned with the scanning direction and that defines an elongate liquid supply opening in a surface facing the substrate, the elongate liquid supply opening being located at the corner.

In an aspect, there is provided an immersion lithographic apparatus to project an image onto an image field on a substrate through a body of liquid confined on a surface of the substrate by a liquid confinement system, while the substrate is scanned in a scanning direction, wherein the liquid confinement system has a liquid confinement member that has a surface facing the substrate, an elongate liquid supply opening defined in the facing surface and positioned in the scanning direction in front of the image field.

In an aspect, there is provided a liquid confinement system arranged to confine a liquid to a space between a projection system and a facing surface being a substrate and/or a table configured to support the substrate comprising a liquid confinement member bordering the space, the projection system having an optical axis and being arranged to project an image into an image field having a maximum dimension, in a direction perpendicular to the optical axis and the scanning direction, that is smaller than a maximum dimension of the space in the direction, the liquid confinement member defining a continuous, elongate liquid supply opening arranged to direct liquid toward the facing surface, the elongate liquid supply opening having a dimension in the direction that is greater than the maximum dimension of the image field and less than the maximum dimension of the space In an aspect, there is provided a liquid confinement system for an immersion lithographic apparatus, the liquid confinement system configured to confine immersion liquid on a surface of a substrate while the substrate is scanned in a scanning direction, wherein the liquid confinement system has an elongate liquid supply opening arranged to create a region of relatively high shear and pressure gradient in the liquid so as to divert a bubble of gas in the liquid away from an image projected onto the substrate through the liquid.

In an aspect, there is provided a liquid confinement system for an immersion lithographic apparatus, the liquid confinement system configured to confine immersion liquid on a surface of a substrate and having a liquid confinement member comprising a plurality of liquid supply openings formed in a surface facing the substrate, the plurality of liquid supply openings including openings of at least two different lengths.

In an aspect, there is provided a liquid confinement system for an immersion lithographic apparatus, the liquid confinement system configured to confine immersion liquid on a surface of a substrate and having a liquid confinement member that has at least one corner aligned with a scanning direction in which the substrate is scanned and comprising an elongate liquid supply opening formed in a surface facing the substrate, the elongate liquid supply opening being located at the corner.

In an aspect, there is provided a liquid confinement system for an immersion lithographic apparatus, the liquid confinement system configured to confine immersion liquid on a surface of a substrate and having a liquid confinement member comprising a facing surface facing the substrate, an elongate liquid supply opening formed in the facing surface and positioned in a scanning direction in which the substrate is scanned, in front of an image field projected onto the surface of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a fluid handling structure as a liquid supply system for use in a lithographic projection apparatus;

FIG. 4 depicts a further liquid supply system for use in a lithographic projection apparatus;

FIG. 5 depicts, in cross-section, a fluid handling structure;

FIG. 6 depicts, in plan, a fluid handling structure according to an embodiment of the invention;

DETAILED DESCRIPTION

Figure 1:
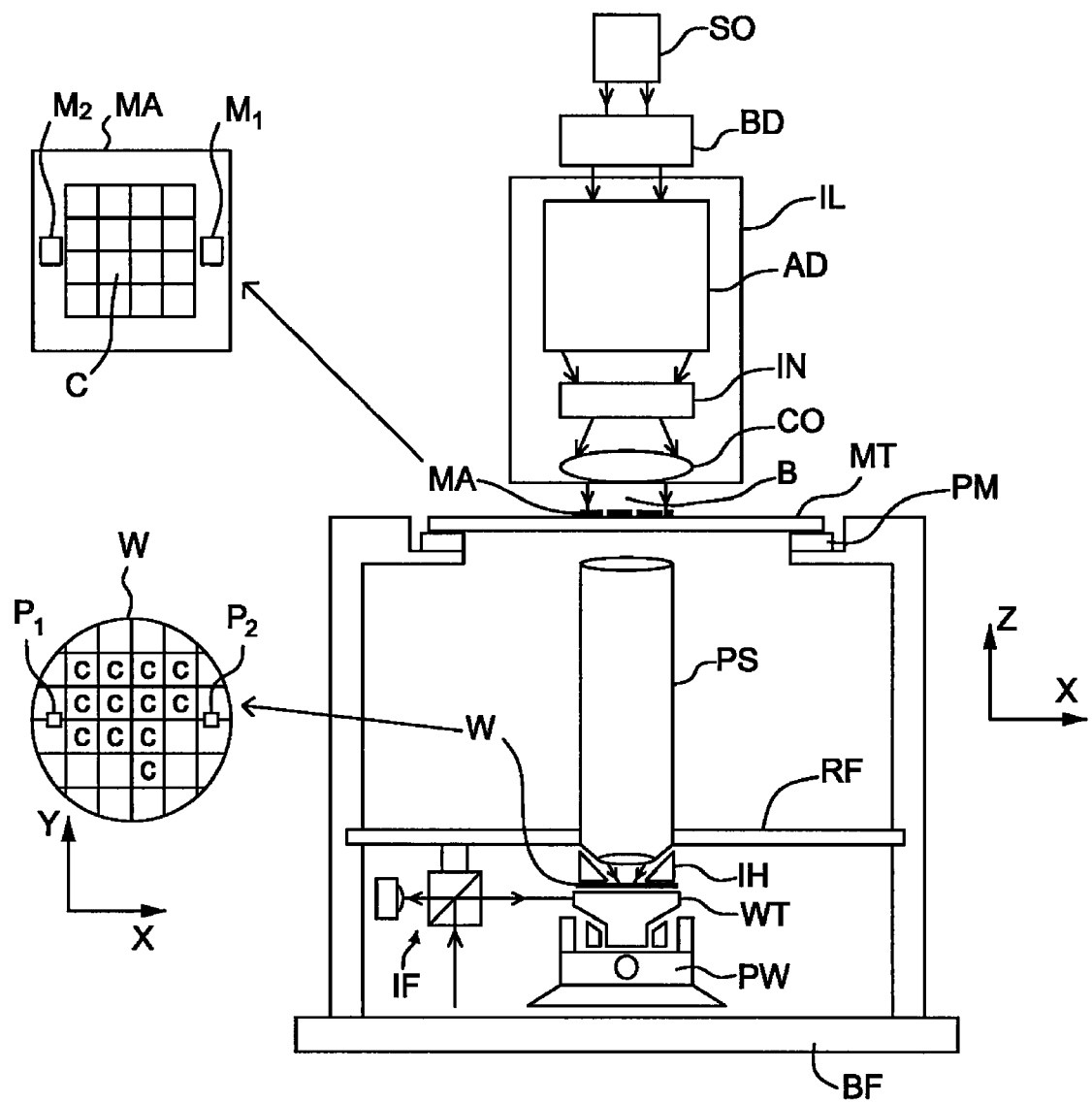
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables, such as substrate tables, (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement to provide liquid between a final element of the projection system PS and the substrate is the so called localized immersion system IH. In this system a fluid handling structure is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of fluid handling structure are illustrated in FIGS. 2-5.

As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets on either side of the projection system PS and is removed by a plurality of discrete outlets arranged radially outwardly of the inlets IN. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlet openings to use can depend on the direction of movement of the substrate W (the other combination of inlet and outlets being inactive).

Another arrangement which has been proposed is to provide the liquid supply system with a liquid confinement member which extends along at least a part of a boundary of the space between the final element of the projection system and the substrate table. Such an arrangement is illustrated in FIG. 5.

FIG. 5 schematically depicts a localized liquid supply system with a fluid handling structure 12. The fluid handling structure 12 extends along at least a part of a boundary of the space 11 between the final element of the projection system PS and a facing surface which is desirably a substantially flat surface, e.g. the substrate table WT and/or the substrate W. (Please note that reference in the following text to surface of the substrate W also refers in addition or in the alternative to a surface of the substrate table WT, unless expressly stated otherwise.) The fluid handling structure 12 is substantially stationary relative to the projection system PS in the XY plane though there may be some relative movement in the Z direction (in the direction of the optical axis). In an embodiment, a seal is formed between the fluid handling structure 12 and the surface of the substrate W and may be a contactless seal such as fluid seal, such as a liquid seal, desirably a gas seal. Such a system is disclosed in United States patent application publication no. US 2004-0207824, hereby incorporated in its entirety by reference.

The fluid handling structure 12 at least partly contains liquid in the immersion space 11 between a final element of the projection system PS and the substrate W. A contactless seal 16 to the substrate W may be formed in an undersurface 40 of the fluid handling structure 12 around the image field of the projection system PS so that liquid is confined within the space 11 between the substrate W surface and the final element of the projection system PS. Desirably the undersurface 40 is substantially parallel to the facing surface. The immersion space 11 is at least partly formed by the fluid handling structure 12 positioned below and surrounding the final element of the projection system PS. Liquid is brought into the space 11 below the projection system PS and within the fluid handling structure 12 by liquid inlet 13. The liquid may be removed by liquid outlet 13. The fluid handling structure 12 may extend a little above the final element of the projection system PS. The liquid level rises above the final element so that a buffer of liquid is provided. In an embodiment, the fluid handling structure 12 has an inner periphery that at the upper end closely conforms to the shape of the projection system PS or the final element thereof and may, e.g., be round. At the bottom, the inner periphery defined by an edge 20 of the undersurface 40 closely conform to the shape of the image field, e.g., rectangular, though this need not be the case. The undersurface 40 has an outer edge 45 or rim.

The gas seal 16 is formed by gas, e.g. air or synthetic air but, in an embodiment, $N_2$ or another inert gas. The gas in the gas seal 16 is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that a high-velocity gas flow flows inwardly to confine the liquid. The force of the gas on the liquid between the fluid handling structure 12 and the substrate W contains the liquid in an immersion space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Different arrangements may be used as a replacement to the seal arrangement which may also serve as a liquid extractor. An arrangement is a single phase extractor optionally with a gas seal as described in United States Patent Application Publication No. US 2006/0038968, which is hereby incorporated by reference in its entirety. The single phase extractor may have a porous plate in the surface of the fluid handling structure 12 above which a liquid may be supplied at a slight underpressure, e.g. below the bubble point of the porous plate, and below which may be a meniscus between the fluid handling structure and the facing surface so that the liquid but not gas is extracted through the porous plate. In the porous plate openings with a maximum dimension in the range of 5 to 50 μm may be formed. The porous plate may be made of or coated with a lyophilic material.

FIG. 6 illustrates a meniscus pinning device which may replace the seal arrangement 14, 15, 16 of FIG. 5. The meniscus pinning device of FIG. 6 comprises a plurality of discrete (extraction) openings 50. Each opening 50 is illustrated as being circular though this is not necessarily the case. Indeed the shape of one or more of the openings 50 may be one or more selected from a square, a circle, a rectilinear shape, a rectangle, an oblong, a triangle, an elongate shape such as a slit, etc. Each opening 50 has, in plan, a large maximum cross-sectional dimension, such as a diameter, perhaps with a maximum dimension of greater than 0.5 mm, desirably greater than 1 mm. Thus, the openings 50 are unlikely to be affected much by contamination.

Each of the openings 50 of the meniscus pinning device of FIG. 6 may be connected to a separate under pressure source. Alternatively or additionally, each or a plurality of the openings 50 may be connected to a common chamber 51 (which may be annular) which is itself held at an under pressure. In this way a uniform under pressure at each or a plurality of the openings 50 may be achieved. The openings 50 can be connected to a vacuum source and/or the atmosphere surrounding the liquid supply system may be increased in pressure to generate the required underpressure.

Each opening 50 is designed to extract a mixture of liquid and gas, for example in a two phase flow. The liquid is extracted from the space 11 whereas the gas is extracted from the atmosphere on the other side of the openings 50 to the liquid. This creates a gas flow as illustrated by arrows 100. This gas flow is effective to pin the meniscus 90 between the openings 50 substantially in place as illustrated in FIG. 6, for example between neighboring openings 50. The gas flow helps maintain the liquid confined by momentum blocking, by a gas flow induced pressure gradient and/or by drag (shear) of the gas flow on the liquid.

As can be seen from FIG. 6, the openings 50 are positioned so as to form, in plan, a polygonal shape. In the case of FIG. 6 this is in the shape of a rhombus with the principal axes 110, 120 aligned with the major directions of travel of the substrate W under the projection system PS. This helps ensure that the maximum scan speed is faster than if the openings 50 were arranged in a circular shape. This is because the force on the meniscus between two openings 50 is reduced with a factor cos θ, where θ is the angle of the line connecting the two openings 50 relative to the direction in which the substrate W is moving. Throughput can be optimized by having the primary axis 110 of the shape of the openings 50 aligned with the major direction of travel of the substrate (usually the scan direction) and to have a second axis 120 aligned with the other major direction of travel of the substrate (usually the step direction). It will be appreciated that any arrangement in which θ is different to 90° will give an advantage. Exact alignment of the principal axes with the major directions of travel is not vital. It will further be appreciated that if the shape is circular, then there will always be two openings 50 which are aligned perpendicularly to the direction of travel so that the meniscus between those two outlets receives the maximum available force by movement of the substrate W. From the above, it can be seen that even the use of a square shape with the sides aligned at about 45° to the principal directions of travel of the substrate gives a great benefit. However, an embodiment of the present invention is applicable to any shape made by the openings 50 in plan, for example a circle.

Radially outward of the openings may be a gas knife opening through which a gas flow may be supplied during operation. Such an arrangement is described in United States Patent Application Publication No. US 2010/0313974, which is hereby incorporated by reference in its entirety.

Further details of the openings 50 and the fluid handling structure 12 can be found in United States Patent Application Publication No. US 2008/0212046, which is hereby incorporated by reference in its entirety.

Formed in the undersurface 40 are further supply openings 70 which are to supply (or outlet) fluid (e.g. liquid, such as immersion liquid) from the fluid handling structure 12. The supply openings 70 may be considered as inletting liquid into the space 11. The supply openings 70 are radially inwardly, with respect to the optical axis of the projection system PS, of the extraction openings 50. The liquid exiting the supply openings 70 of the fluid handling system 12 is directed towards the substrate W. This type of supply opening 70 is provided in order to reduce the chances of bubbles being generated in the immersion liquid. Gas may become trapped in a gap between the edge of the substrate W and the substrate table WT. At an advancing part of the undersurface of the fluid handling structure 12 relative to the direction of travel of the substrate, the fluid handling structure may be moving sufficiently fast relative to the facing surface of the substrate W such that liquid is unable to flow from the space 11 to the openings 50. A portion of the undersurface of the fluid handling structure 12 between the edge 20 and the openings 50 may become de-wetted, affecting the effectiveness of the meniscus pinning of the openings 50. Supplying liquid through the supply openings 70, desirably near the openings 50, may reduce the risk of bubble inclusion in the immersion liquid and de-wetting of one or more of the openings 50.

The geometry of the supply openings 70 has an impact upon the effectiveness of the fluid handling structure 12 in containing liquid.

In particular, it is desirable that the supply openings 70 have a shape, in plan which is cornered in plan, like the shape of the openings 50. In an embodiment the cornered shapes of the supply openings 70 and openings 50 are desirably substantially similar. In an embodiment at the apex of each corner 52 of each shape is a supply opening 70 or opening 50. Desirably the supply openings 70 are each within 10 mm, desirably 5 mm of an opening 50. All parts of the shape made by the openings 50 are desirably within 10 mm of a part of the shape made by the supply openings 70.

Further details regarding the extraction openings 50 and supply openings 70 may be found in United States Patent Application Publication No. US 2009-0279060 which is hereby incorporated by reference in its entirety.

Figure 7:
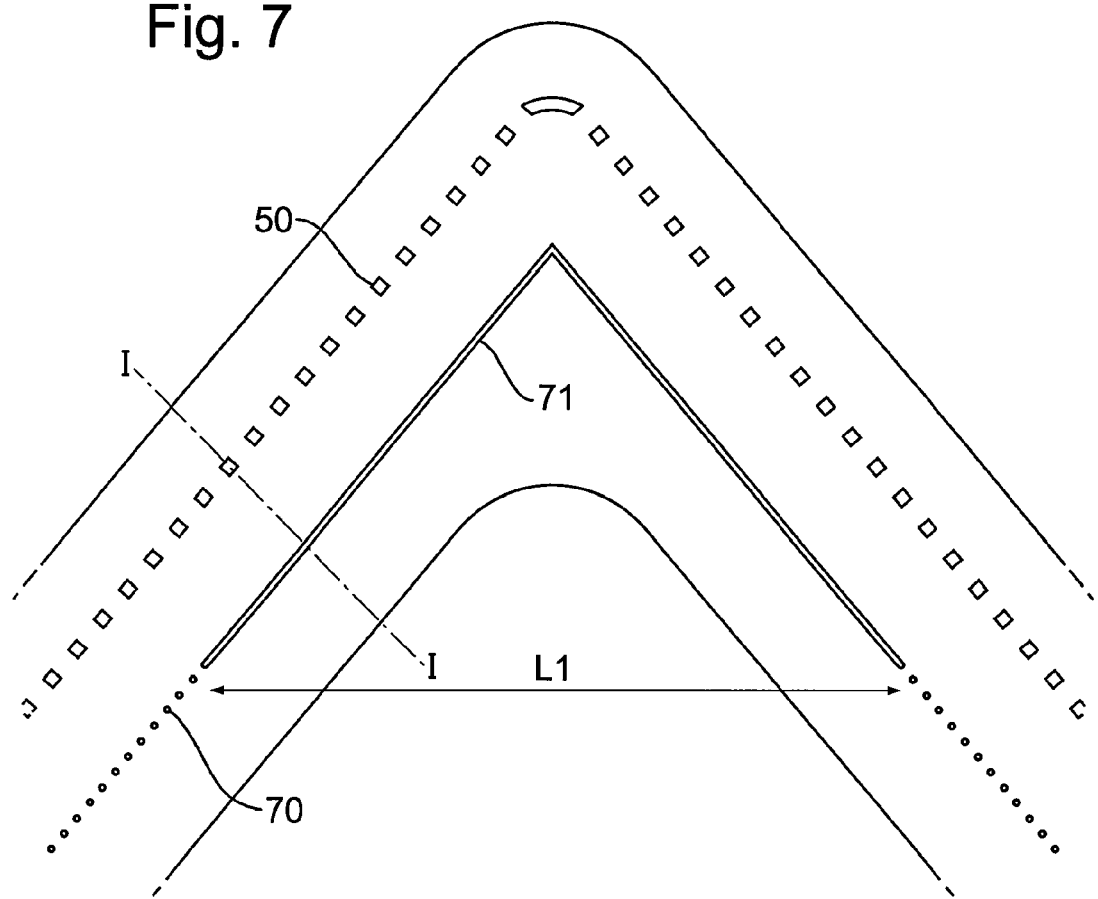
FIG. 7 depicts, in plan, a part of the fluid handling structure of FIG. 6.
Figure 8:
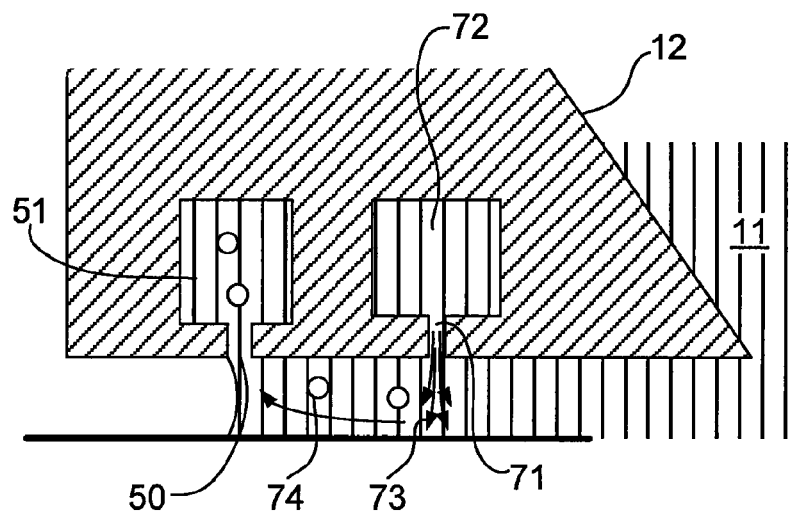
FIG. 8 is a cross-section along the line I-I of the fluid handling structure of FIG. 7.

As shown in more detail in FIGS. 7 and 8, at the corner of the liquid handling structure 12 lying on principal axis 110, a number of the discrete, e.g. circular, supply openings 70 are replaced by a V-shaped slit 71 which is essentially continuous. Supply openings 70 and slit 71 are connected to a chamber 72, which may be annular, through which the liquid is supplied. V-shaped slit 71 has a dimension (or component dimension) L1 in the direction perpendicular to principal axis 110 that is greater than the major dimension (or width) L3 of the image field 130 (shown in FIG. 6). The major dimension (or width) L3 of image field 130 is equivalent to the maximum width of a die that can be imaged by the apparatus. The component dimension L1 is equivalent to the projection of the slit onto the axis perpendicular to the scan direction. The component dimension L1 of slit 71 may be less than the width of the body of immersion liquid that is confined by liquid handling structure 12. In an embodiment the component dimension L1 is less than the width L2 of the central opening of fluid handling structure 12.

In operation liquid supplied through liquid opening slit 71 forms a continuous region of relatively high pressure 73 between it and the substrate W. The pressure gradients and shear flows formed by this region of high pressure 73 serve to deflect a bubble 74 that may be generated at the meniscus near the leading corner of the liquid handling structure 12 during scanning exposures. Such a bubble can be created in several different ways. For example, a bubble may be created by turbulence at two-phase outflows, if a droplet on the substrate collides with an advancing meniscus or when the confined body of immersion liquid passes over a height step, for example a gap or groove, such as between the edge of the substrate and the substrate table. Once present in the immersion liquid, a bubble tends to remain stationary relative to the substrate and so can be swept into the projection beam by the scanning movement of the substrate. By diverting any such bubble away from the image field 130 the risk of a defect being caused by printing of a bubbles is reduced, if not avoided. The high pressure region formed by liquid emitting from slit 71 can be regarded as forming a bubble shield for the image field 130.

In an embodiment, the component dimension L1 is greater than or equal to three times the major dimension L3 of image field 130. In this arrangement the high pressure region also sweeps across the next target portion while imaging the current target portion. This assists in clearing a target portion in advance of its exposure. In an embodiment, the high pressure region is equal or greater than the width of three dies so that this advantage can be achieved in whichever direction the substrate is moved, e.g. stepped if the present move is a scan.

The size of a bubble that can be deflected by the high pressure region formed by liquid emitting slit 71 depends on various parameters of the apparatus, including the rate of flow of liquid, the height of the fluid handling structure 12 above the substrate W and the width of slit 71. To deflect bubbles that have attached to the surface beneath the fluid handling structure, further parameters are relevant, including the hysteresis of contact angle of the surface beneath the slit 71, and the contact angle (SACA) of the surface underneath slit 71.

In an embodiment; the rate of supply of liquid through slit 71 and supply openings 70 is equal to or greater than 1 l/min, equal or greater than about 1.25 l/min, equal to or greater than about 1.5 l/min, or equal to or greater than about 2 l/min. In an embodiment of the invention, the rate of supply of liquid through slit 71 and supply openings 70, as well as the rate of outflow of liquid through openings 50 is selected so that there is a net outflow of liquid from the main body of confined liquid by the liquid handling structure, for example within the central opening of the liquid handling structure 12. Liquid is supplied to the immersion space by liquid inlet 13. In this way, it is possible to ensure that there is no mixing of liquids with different temperatures.

In an embodiment the slit 71 has a width (e.g., the dimension across the slit 71 along line I-I shown in FIG. 7) of less than or equal to about 100 μm, less than or equal to about 70 μm, less than or equal to about 50 μm, less than or equal to about 30 μm, or less than or equal to about 20 μm. In an embodiment, the slit 71 has a width of greater than or equal to about 10 μm. The discrete liquid supply openings 70 and continuous slit 71 together make a complete loop around the liquid handling structure 12. In an embodiment, the width of the slit and the size and spacing of the supply openings 70 are selected such that the total opening area per unit length is constant around the loop. For example, the area of a supply opening 70 times the number of openings 70 per unit length for the arrangement of supply openings 70 equals the width of the slit 71. For example an approximation may mean that the area of the slit 71 per unit length (i.e., the width of slit 71) is equal to the number of supply openings 70 per unit length of the arrangement of supply openings 70 multiplied by the square root of the area of each of the supply openings 70. This assumes that the openings are of approximately the same size along the arrangement of supply openings.

In an embodiment, during operation the distance between a facing surface which forms slit 71 and the substrate or substrate table, known as the flight height, is less than or equal to about 200 μm, less than or equal to about 180 μm, less than or equal to about 150 μm, or less than or equal to 130 μm. In an embodiment, the flight height is greater than or equal to about 100 μm.

The surface beneath the slit 71 may have a contact angle greater than or equal to about 60°, greater than or equal to about 70°, greater than or equal to about 80°, greater than or equal to about 90°, greater than or equal to about 100°, or greater than or equal to about 110°. The surface beneath the slit may have a hysteresis of contact angle to the liquid of less than or equal to about 20°, less than or equal to about 15°, less than or equal to about 10°, or less than or equal to about 5°. Desirably, the hysteresis of contact angle (difference between advancing and receding contact angles) is as small as possible. The smaller the hysteresis, the easier it is for any bubbles to be dislodged from the substrate by the bubble deflecting device. With a smaller hysteresis a smaller force is required to move a bubble.

The high pressure region formed by slit 71 may be effective to deflect bubbles having a size greater than or equal to about 30 μm, greater than or equal to about 20 μm, greater than or equal to about 15 μm, greater than or equal to about 10 μm, or greater than or equal to about 5 μm. In an embodiment of the invention, small bubbles can be allowed to pass the high pressure region because they will dissolve in the immersion liquid, which has very low levels of dissolved gasses, before reaching the projection beam. The size of bubble that will dissolve in time depends upon the distance between the high pressure region and the image field and the rate of motion of the substrate and immersion liquid. In an embodiment, bubbles of less than 5 μm diameter will dissolve before reaching the projection beam.

The ability of the bubble deflecting device to deflect bubbles of a given diameter that are attached to the surface beneath the fluid handling structure can be determined from consideration of a capillary number defined below. A bubble should be deflected if $\Delta Ca$ is greater than zero, where:

$$\Delta Ca = Ca - Ca_{critical}$$

$Ca_{critical}$ is defined in Dimitrakopoulos and Higdon, '*On the displacement of three-dimensional fluid droplets from solid surfaces in low-Reynolds-number shear flows*', Journal of Fluid Mechanics vol. 377, pp. 189-222, 1998. The definition of the capillary member Ca is based on a total shear rate, which takes account of any non-uniform shear and of pressure gradients. The total shear rate is calculated using computational fluid dynamics (CPD) for a particular application, taking into account relevant parameters such as slit width, flow rate, flight height, velocity of scan, hysteresis of contact angle, etc.

The capillary member, Ca is defined as:

$$Ca = \frac{G_{tot} a}{\gamma}$$

where a is the equivalent bubble radius (i.e. the radius of a spherical bubble having the same volume as the bubble under consideration), γ is the surface tension and $G_{tot}$ is:

$$G_{tot} = [\underline{T} - 2 \ R \cdot \underline{Gradp}] \frac{v}{\|v\|}$$

where: R is the radius of the base of a bubble, T is wall shear stress, Grad p is the pressure gradient at wall; and v is the scan speed. T and Grad P are calculated with the CFO mode.

A typical volume of $Ca_{critical}$ for a bubble, for example, on a surface of 90° advancing contact angle and 20° hysteresis is 0.11. Based on such an example and a scan speed of 0.75 m/s, suitable parameter values for an embodiment of the invention are:

flight height—100 to 130 μm
slit width—20 to 30 μm
flow rate—1.5 to 2 l/min
Desirable values may be:
flight height—120 μm
slit width—20 μm
flow rate—2 l/min It should be noted that the bubble deflecting device of an embodiment will not necessarily detach a bubble that has attached to the surface beneath the fluid handling structure but can merely displace it out of the way of the image field. If a bubble is detached or was originally floating, it is likely that it would be deflected much more easily than a bubble attached to a surface.

Figure 9:
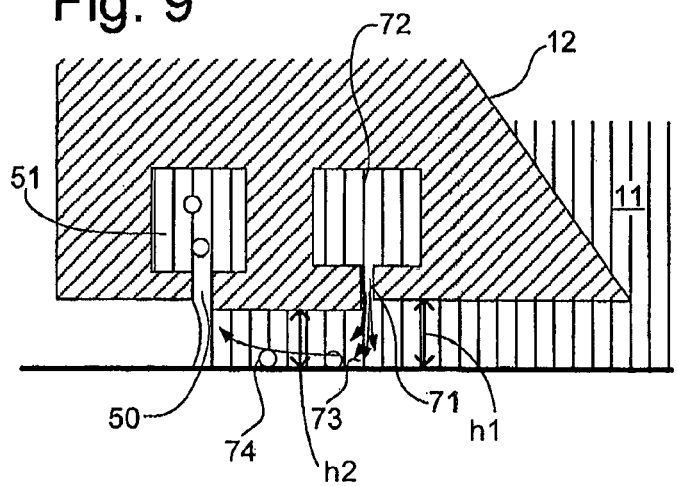
FIG. 9 is a view similar to FIG. 8 of a further fluid handling structure according to an embodiment of the invention.

FIG. 9 depicts in cross-section a part of a liquid handling structure 12 according to an embodiment of the present invention. This embodiment of the invention is the same as that described previously, except as discussed below, so a description of common features is omitted for conciseness. As can be seen in FIG. 9, the distance h1 is the distance between the lower surface of liquid handling structure 12 and substrate W inwardly of slit 71. The distance h2 is between the lower surface of liquid handling structure 12 and substrate W outside of slit 71. The distance h1 is greater than the distance h2. In the lower surface of the liquid handling structure 12 there is a step at the slit 71. With such a step, the Coanda effect means that the liquid exiting slit 71 tends to flow around the step and therefore outwardly, away from the optical axis of the projection system PS. The outward direction of the liquid flow from the slit 71 is desirable because it can improve the bubble deflecting effect.

Figure 10:
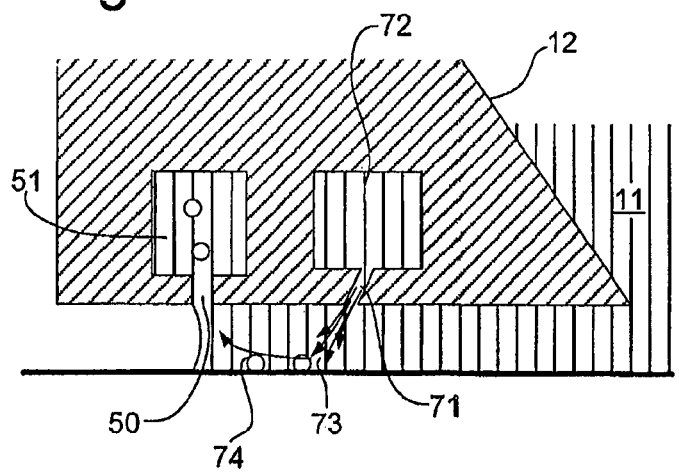
FIG. 10 is a view similar to FIG. 8 of a further fluid handling structure according to an embodiment of the invention.

FIG. 10 is a cross-sectional view of a liquid handling structure according to a further embodiment of the present invention. The features and function of the embodiment are the same as described above with respect to FIG. 9 and, for conciseness, except as described below. As shown in FIG. 10, in this embodiment passage of the slit 71 through the lower surface of the liquid handling structure 12 is angled at an acute angle to the surface of substrate W, so that the liquid exiting the slit 71 flows downwardly and outwardly. Similarly to the embodiment of FIG. 9, the additional outward flow of liquid can improve the bubble deflecting effect.

The elongate slit 71 may be provided in a fluid handling structure of any shape in plan, including for example circular liquid confinement structures. In circular or curved liquid confinement structures, the elongate slit may be curved or straight.

Figure 11:
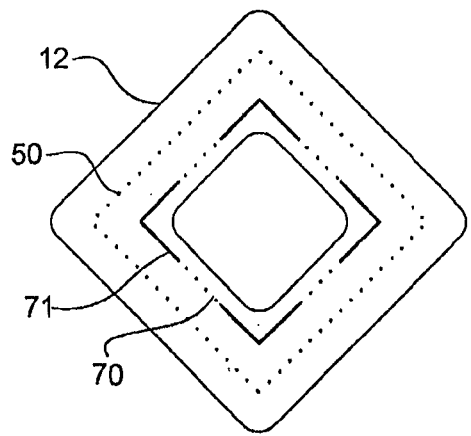
FIGS. 11 and 12 are plan views of fluid handling structures according to embodiments of the invention.
Figure 12:
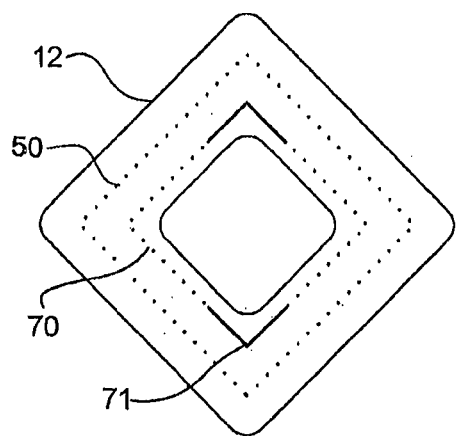

In an embodiment, the elongate slit 71 is provided on all four corners of a quadrilateral liquid handling structure 12. The elongate slit 71 may located on each corner which leads the liquid handling structure 12 during movement relative to a substrate, for example when stepping as well as scanning, as shown in FIG. 11. In an embodiment as shown in FIG. 12, the elongate slit 71 is provided only on the corners that lead when scanning. Slit 71 can have a shape which is straight or curved, for example with a positive radius of curvature relative to the optical axis of the projection system, and can include one or more corners or bends. If slit 71 has corners, e.g. aligned with the stepping and/or scanning directions of the substrate, these corners can be rounded or curved with a positive radius of curvature. The elongate slit 71 can be regarded as a bubble deflecting device.

In an embodiment, two or more slits with two adjacent slits being parallel may be provided at one corner of the liquid handling structure to form two or more high pressure regions that deflect bubbles. In this way, any bubble that passes the first high pressure region will encounter the second or successive high pressure region and might be deflected thereby. Each successive high pressure region might deflect a bubble by a certain amount but not enough to avoid the image field. However, the combined deflection may be sufficient to prevent the bubble entering the image field. In an embodiment the two adjacent slits need not be exactly parallel, for example within 5, desirably 3, desirably 1 degree of parallel.

Figure 13:
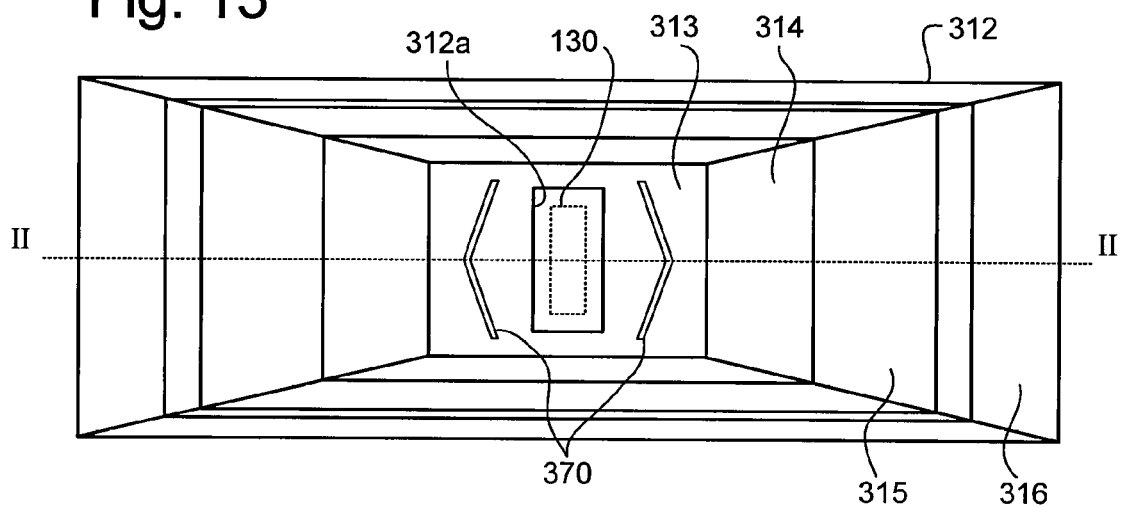
FIGS. 13 and 14 are respectively plan and sectional views of a fluid handling structure according to an embodiment of the invention.
Figure 14:
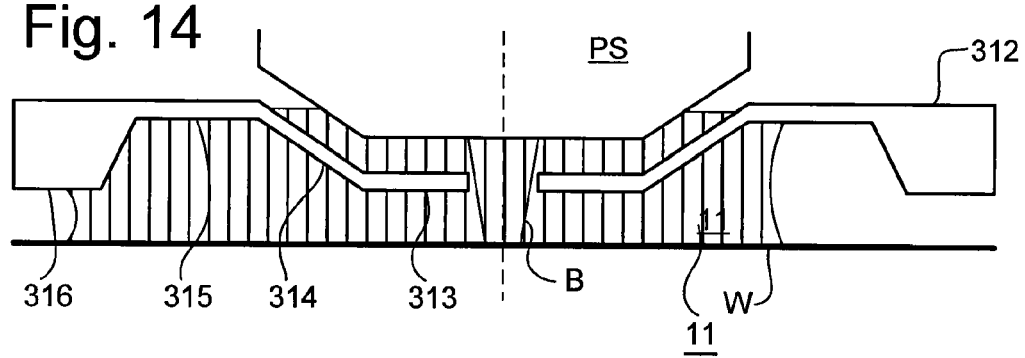

FIGS. 13 and 14 show a liquid handling structure according to an embodiment of the invention. FIG. 13 is a view from below of the liquid handling structure 312. FIG. 14 is a cross-sectional view of the liquid handling structure 312 along the line of FIG. 13 during use. Liquid handling structure 312 is generally rectangular and has a central aperture 312a through which the beam B can pass to irradiate image field 130. Liquid handling structure 312 is divided into a number of concentric zones surrounding the central aperture 312. The first zone 313 has the form of a thin plate, referred to as a flow plate, that in use is positioned between the bottom of the projection system PS and the substrate W. The face of zone 313 facing the substrate W has formed therein V-shaped slits 370 either side of the central opening 312a. In use, liquid is supplied through conduits (not shown) within liquid handling structure 312 so as to be emitted from V-shaped slits 370 so as to form high pressure regions within immersion liquid 11 that act to deflect bubbles as in the above embodiments.

Outwardly of flow plate 313 is a transition region 314 which is shaped so that the distance between the substrate W and lower surface of liquid handling structure 312 increases during this region. Outward of the transition region 314 is a main liquid extraction region 315. In this region the lower surface of the liquid handling structure 312 is spaced further apart from the substrate W than is the lower surface of the flow plate region 313. The lower surface in the liquid extraction region 315 is provided with a plurality of openings, for example in the form of a porous plate, connected to conduits (not shown) within the liquid handling structure 312 which are connected to a source of under pressure in order to extract liquid and/or gas, for example in a single phase flow.

Outermost is a seal region 316 the lower surface of which is spaced from the substrate W by a similar distance than is the lower surface flow plate 313. The seal region 316 serves to limit loss of immersion fluid and may also contain openings, for example in the form of a porous plate, connected via conduits (not shown) within liquid handling structure 312 to extract liquid and/or gas. Depending upon the speed and direction of motion of the substrate the meniscus of the immersion liquid 11 may be located within the main extraction zone 315 or the seal region 316. In this embodiment, similar values for the various parameters affecting bubble deflection as used in the above embodiments can be adopted.

In order to further mitigate the occurrence of bubbles into the space 11 an embodiment of the present invention further comprises a gas supplying device configured to supply gas to a region (e.g. to a volume, or a towards an area) adjacent the space 11. Such a gas supplying device is disclosed in U.S. patent application Ser. No. 12/961,586 filed 7 Dec. 2010, which is hereby incorporated by reference in its entirety. Localized area fluid handling systems such as those described above may suffer from bubble inclusion into the space 11. When a meniscus extending between the fluid handling system 12 and the surface under the fluid handling system 12 (meniscus 320 as shown in FIG. 5) and a droplet collide on the surface, for example a droplet of liquid which has escaped the space 11, a bubble of gas may be included into the space 11. Inclusion of a bubble into the space 11 is detrimental because a bubble of gas can lead to an imaging error. A droplet is usually left behind on the surface in, for example, one of at least three circumstances: (a) when the liquid handling device is located over the edge of a substrate W when there is relative movement between the liquid handling device and the substrate W; (b) when the liquid handling device is located over a step change in height of the facing surface facing the liquid confinement structure when there is relative movement between the liquid handling device and the facing surface; and/or (c) due to too high relative speed between the liquid handling device and the facing surface, for example when the meniscus becomes unstable, e.g. by exceeding the critical scan speed of the facing surface. A bubble may be included at the meniscus 400 illustrated in FIG. 5 extending between the liquid confinement structure 12 and the projection system PS. Here a bubble of gas could be created by liquid supplied from a liquid inlet (inlet 13 in FIG. 5) on the radially inward facing surface of the liquid handling system 12 entraining gas from between the projection system PS and the liquid handling device 12.

Very small bubbles of gas may dissolve in the immersion liquid before they reach the image field 130 (illustrated in FIG. 6) of the space 11. An embodiment of the present invention uses the fact that dissolution speed is dependent upon the type of the trapped gas and the immersion liquid properties.

A bubble of carbon dioxide ($CO_2$) typically dissolves faster than a bubble of air. A bubble of $CO_2$ which has a solubility fifty-five (55) times larger than that of nitrogen and a diffusivity of 0.86 times that of nitrogen will typically dissolve in a time thirty-seven (37) times shorter than the time for a bubble of the same size of nitrogen to dissolve.

An experiment was carried out in which ultra pure water had been degassed by boiling it. The water was then cooled and a vacuum of −950 mbar was applied. Bubbles of ambient air and $CO_2$ were placed on the edge of a substrate placed in the water. The bubbles had a size of between 0.5 and 1 mm. After 30 seconds, the size of the bubbles of $CO_2$ had reduced to between 0.1 mm and 0.3 mm and the bubbles of $CO_2$ were no larger than 0.1 mm after 1 minute. During this time the size of the bubbles of air did not vary appreciably.

An analytical formula for the change in bubble diameter with time is:

$$\frac{dD_{bub}}{dt} = \frac{Sh \cdot Diff \cdot Sol \cdot RT \left( P_{hyd} + \frac{4\sigma}{D_{bub}} \right)}{\frac{1}{2} P_{hyd} D_{bub} + \frac{4}{3}\sigma}$$

where: R is the universal gas constant; T the temperature; Diff the diffusivity; Sol the solubility; t time; $D_{bub}$ the diameter of the bubble; Sh the Sherwood number (kd/Diff, where: k is the mass transfer coefficient and d the characteristic dimension); $P_{hyd}$ is the hydraulic pressure; and σ is the surface tension.

The equation shows that $CO_2$ bubbles with a diameter of lower than 1 mm will dissolve in the time scale of 1 or 2 minutes. In comparison, a bubble of nitrogen will dissolve in the hour time scale. This is in agreement with the above mentioned experiment.

Another analytical model relates dissolution time τ to the bubble diameter, diffusivity, solubility, the universal gas constant and temperature.

$$\tau = \frac{D_{bub}^2}{6 Sh \cdot Diff \cdot Sol \cdot RT}$$

The second equation shows that a bubble of $CO_2$ of 1 mm diameter will dissolve in about 70 seconds compared to 110 seconds predicted by the first analytical model.

Therefore, the experimental result broadly agrees with the above two analytical models. Faster dissolution is achieved by a higher solubility and/or a higher mass transfer coefficient. For a given set of flow conditions and geometry, to a first order approximation, the Sherwood number is independent of the gas or liquid concerned. This shows that the mass transfer coefficient and diffusivity are substantially proportional. Therefore although the diffusivities on the top line of the first equation and on the bottom line of the second equation cancel out, because the mass transfer coefficient is proportional to diffusivity, a higher diffusivity leads to faster dissolution. Therefore suitable gases may have a higher solubility and/or a higher diffusivity. Suitable gases may have a product of diffusivity and solubility in the immersion liquid which is greater than that of air.

Using the results obtained by the analytical models it is possible to determine about how quickly a bubble of a particular gas can be expected to dissolve in liquid. A bubble included at the meniscus 320 may be stationary relative to the facing surface, and may be positioned on the substrate. The bubble may move through the space towards the image field 130. In order for imaging defects to be reduced or avoided, an included bubble desirably dissolves before it reaches the image field 130 to be exposed by the projection beam B. For a given fluid handling system the distance between the expected position of the meniscus 320 and the image field 130 is known. The distance of travel of the bubble may be equivalent to the distance of travel of the substrate W under the projection system PS from the position at which the bubble is included into the liquid to the position at which the bubble is in the exposure area. So for a high scan speed a bubble will need to dissolve faster than for a slow scan speed, because the time taken for the bubble to reach the image field 130 from the meniscus 320 will be less than for a lower scan speed.

If the bubble of gas is of a gas which has a high diffusivity, high solubility or high product of diffusivity and solubility in the immersion liquid, it will dissolve into the immersion liquid much faster according to the above two analytical models. Therefore, using an embodiment of the invention will reduce the number of imaging defects thereby allowing higher throughput (e.g., higher speed of the substrate W relative to the liquid handling system 12) and lower defectivity.

Therefore, an embodiment of the present invention provides a gas supplying device configured to supply gas to a region (e.g. to a volume, or a towards an area) adjacent the space 11. In particular, gas is provided such that it is present in the region adjacent to the meniscus 320 extending between the facing surface and the liquid handling device 12 and/or adjacent to the meniscus 400 extending between the liquid handling device 12 and the projection system PS.

Gases which are suitable are, for example, those with solubilities (mass of gas per unit mass of immersion liquid at a total pressure of 1 atm (sum of the partial pressures of gas and immersion liquid)) in the immersion liquid (for example, water) of greater than $1 \times 10^{-3}$ at 20° C. and 1 atm total pressure. Volume of gas rather than weight of gas may be more important because a certain volume of gas rather than weight is needed to fill the region adjacent the space. Therefore, the solubility may be better expressed in mols of gas per kg of liquid (i.e. in mol/kg). In that case the solubility should be greater than $5\times10^{-3}$ mol/kg, desirably greater than $10\times10^{-3}$ mol/kg, $15\times10^{-3}$ mol/kg, $20\times10^{-3}$ mol/kg or $25\times10^{-3}$ mol/kg.

Gases which are suitable are, for example, those with diffusivities of greater than $3\times10^{-5}$ cm$^2$ s$^{-1}$ at 20° and 1 atm total pressure. This compares to that of air which is $2.3\times10^{-5}$ cm$^2$ s$^{-1}$. Desirably the diffusivity is greater than $8\times10^{-5}$, $1\times10^{-4}$, or $5\times10^{-4}$ cm$^2$ s$^{-1}$. Most gases have a diffusivity of between $1–2\times10^{-5}$ cm$^2$ s$^{-1}$. Both oxygen and nitrogen have a diffusivity of $2.3\times10^{-5}$ cm$^2$ s$^{-1}$ and carbon dioxide is $1.6\times10^{-5}$ cm$^2$ s$^{-1}$. Helium has a diffusivity of $3.8\times10^{-5}$ cm$^2$ s$^{-1}$ (and a solubility of $1.6\times10^{-6}$ kg/kg or $4\times10^{-4}$ mol/kg). Hydrogen has a diffusivity of $5.8\times10^{-5}$ cm$^2$ s$^{-1}$ (and a solubility of $1.6\times10^{-6}$ kg/kg or $8\times10^{-4}$ mol/kg).

Particularly desirable are gases with solubilities of greater than $1\times10^{-3}$ kg/kg or $3\times10^{-3}$ mol/kg at 20° C. and 1 atm total pressure and/or diffusivities in the immersion liquid of greater than $3\times10^{-5}$ cm$^2$ s$^{-1}$ at 20° C. and 1 atm pressure. In an embodiment the gas is a gas which has a product of diffusivity and solubility greater than that of air. For example, the product of diffusivity and solubility should be greater than $1\times10^{-9}$ cm$^2$ s$^{-1}$ (using a mass ratio for the solubility) or $2\times10^{-8}$ mol cm$^2$ s$^{-1}$ kg$^{-1}$ (using mol/kg for solubility). Desirably the product of solubility and diffusivity is greater than $5\times10^{-9}$, $1\times10^{-8}$ or $3\times10^{-8}$ cm$^2$ s$^{-1}$ (using a mass ratio for the solubility) or $4\times10^{-8}$, $10\times10^{-8}$, $20\times10^{-8}$, $40\times10^{-8}$ or $50\times10^{-8}$ cm$^2$ s$^{-1}$ mol kg$^{-1}$ (using mol/kg for solubility). An example gas is carbon dioxide.

In an embodiment, gases with a product of solubility and diffusivity greater than that of air (at 20° C. and 1 atm total pressure) are used. The solubility may be measured in kg/kg or in mol/kg. Gases with those properties will dissolve in the immersion liquid faster than air thereby allowing a higher scan speed to be used with low or no risk of bubbles included at the meniscus 320, 400 from still being present in the exposure area at exposure time.

An example gas is carbon dioxide which may be desirable because it is readily available and may be used in immersion systems for other purposes. Carbon dioxide has solubility in water at 20° C. and 1 atm total pressure of $1.69\times10^{-3}$ kg/kg or $37\times10^{-3}$ mol/kg. Other suitable gases may be chlorine ($7.0\times10^{-3}$ kg/kg or $98\times10^{-3}$ mol/kg), hydrogen sulphide ($3.85\times10^{-3}$ kg/kg or $113\times10^{-3}$ mol/kg), hydrogen chloride (0.721 kg/kg or $19753\times10^{-3}$ mol/kg), ammonia (0.531 kg/kg or $31235\times10^{-3}$ mol/kg) or sulphur dioxide (0.113 kg/kg or $1765\times10^{-3}$ mol/kg). Some of those gases may have one or more disadvantages. For example, some of those gases may react with components in the immersion lithographic apparatus and/or may be poisonous and may therefore be harder to handle and less desirable than carbon dioxide. Any non-reactive gas which readily dissolves in immersion liquid is suitable.

These gases used in an embodiment of the invention contrast to oxygen and nitrogen which have solubilities in water of $4.34\times10^{-5}$ kg/kg or $1.36\times10^{-3}$ mol/kg and $1.90\times10^{-5}$ kg/kg or $0.68\times10^{-3}$ mol/kg at 20° C. and 1 atm total pressure respectively. Either of oxygen or nitrogen or air, of which those two gases form the predominant part, are therefore unlikely to dissolve before reaching the image field 130 of the space 11.

The gas supplying device supplies gas with a solubility in immersion liquid of greater than $1\times10^{-3}$ kg/kg or $5\times10^{-3}$ mol/kg at 20° C. and 1 atm total pressure to the exclusion of other gases. So any gas exiting the gas supply device may have a solubility of greater than $1\times10^{-3}$ kg/kg or $5\times10^{-3}$ mol/kg. Such a gas supplying device is therefore distinguishable from a gas supplying device supplying air (which includes carbon dioxide), because air includes oxygen and nitrogen which have lower solubilities than $1\times10^{-3}$ kg/kg or $5\times10^{-3}$ mol/kg.

An embodiment of the present invention herein described may form a $CO_2$ atmosphere around the meniscus 320, 400 of immersion liquid so that any inclusion of gas into the immersion liquid creates a gas inclusion which dissolves in the immersion liquid. Dissolving $CO_2$ in the immersion liquid prior to supplying the immersion liquid to the space (for example to change the resistivity of the immersion liquid) provides the $CO_2$ as a solute and not a gas. Supplying a solute of $CO_2$ would not work in the same way as an embodiment of the present invention because the $CO_2$ is supplied in the immersion liquid. In providing the $CO_2$ as a solute in the immersion liquid instead of a gaseous atmosphere in the region of the meniscus, the $CO_2$ has already dissolved in the liquid in the space. The $CO_2$ is not present in the gas of an included bubble, so the presence of the $CO_2$ in the immersion liquid would not facilitate the reduction in the size of the included bubble. Such an arrangement could be considered to be contrary to the way an embodiment of the present invention works.

In an embodiment the immersion liquid is degassed prior to being supplied to the space 11. In an embodiment, minimal, desirably no, gas is dissolved in the immersion liquid after degassing and prior to being supplied to the space 11. In particular, no component exists deliberately to dissolve gas in the immersion liquid between the immersion liquid being degassed and being supplied to the space 11. Previously it has been suggested to dissolve carbon dioxide in immersion liquid prior to providing it to the space 11 in order to change the acidity or electrical conductivity of the immersion liquid, for example to help prevent corrosion of one or more components which contact the immersion liquid. However, addition of carbon dioxide need only be added sufficiently to prevent corrosion, below the concentration of carbon dioxide at which the effect of an embodiment of the present invention on an included bubble is not appreciable. In an embodiment of the present invention, a high concentration of carbon dioxide dissolved in the immersion liquid may be undesirable because deliberately dissolving gas into the immersion liquid above a certain concentration will reduce the solubility of that gas in immersion liquid. The presence of the gas in solution (at least above a certain threshold) could thereby reduce the likelihood that the gas of an included bubble will dissolve quickly enough to help reduce, if not avoid, the chance of an imaging defect.

In an embodiment, a gas atmosphere is created at the liquid meniscus 320, 400. That may include enclosing the exposure area of the immersion lithographic apparatus with gas. The exposure area may include the entire area surrounding the end of the projection system PS. In an embodiment, the entire inside of the apparatus has the gas supplied to it. In an embodiment, a local supply of gas to the meniscus 320, 400 is provided. For example, separate openings can be provided in the liquid handling system 12 to provide gas to the meniscus 320, 400. In an embodiment, the gas may be provided through a gas knife, as described herein. In an embodiment, gas may be supplied to the region of the barrier member, for example as a purging gas.

Typically the gas supplying device comprises a source of gas and an opening which is connected to the source of gas via a conduit. In an embodiment the gas is provided in a fluid handling system so that a gas atmosphere of a high solubility gas surrounds the entire liquid handling device 12 or liquid contained by the liquid handling device 12. The liquid confinement structure 12 is in a gas atmosphere, for example shrouded in a gas cloud, supplied in the region of the fluid handling system, for example as a purging gas. The gas could be provided through a gas opening separate from (e.g. adjacent to) the liquid confinement structure 12. The opening could be at the end of a conduit which extends between the gas opening and a source of gas. The gas opening may be one or more openings around the periphery of the liquid confinement structure 12. The opening may surround the liquid confinement structure 12.

In an embodiment, the opening for high solubility gas may be formed in the fluid handling system 12. Reference can e.g. be made to the gas supplying systems as described in U.S. patent application Ser. No. 12/961,586 filed 7 Dec. 2010, which is hereby incorporated by reference in its entirety. For example, the gas opening may be an integral opening formed in the surface of the liquid confinement structure 12. Gas with high solubility in immersion liquid exiting the gas opening may thereby be adjacent the meniscus 320 as shown in FIG. 5. Gas exiting the opening may be included into the immersion liquid in the space 11 in a gas bubble upon collision of a liquid droplet with the meniscus 320. Because the gas is easily absorbed into the immersion liquid, it will desirably be absorbed into the immersion liquid before reaching the optical path in the space 11. A gas opening as described could be applied in any type of fluid handling system 12, for example, at a position adjacent an extractor. Further, referring to FIG. 5, a further gas opening can be arranged to provide gas adjacent the meniscus 400 extending between the liquid confinement structure 12 and the projection system PS. The further opening desirably is positioned radially outwardly of the expected position of the meniscus 400.

Pre-existing gas supplying features, such as a gas outlet as e.g. shown in FIG. 5 could be used in the gas supplying device to supply the gas with high solubility in immersion liquid described herein. Gas supplied out of opening 15 in FIG. 5 could consist or consist essentially of the gas with a solubility in the immersion liquid of greater than $1 \times 10^{-3}$ kg/kg or $5 \times 10^{-3}$ mol/kg at 20° C. and 1 atm total pressure. In such case, the opening 15 could be connected to a source of gas. Thus, existing designs of fluid handling system 12 could be used. In using an existing design of fluid handling system 12, the size of the system 12 can at least be maintained if not minimized.

The gas is supplied in such a way that environmental gas (e.g. air) is largely expelled from the environment of the liquid/gas separation line (e.g. at meniscus 320, 400). The gas may be supplied at or radially outward of the meniscus 320, 400. In an embodiment, the gas is supplied as a purging gas to shield the meniscus from the ambient environmental gas. In an embodiment, the gas is supplied to confine the liquid in the reservoir or immersion space. The gas may be supplied between the liquid handling system and a facing surface (for example, a substrate table and/or a substrate) to form a seal therebetween. The supplied gas may form a barrier between the meniscus of the immersion liquid and the ambient atmosphere of, for example, air.

The atmosphere to which meniscus 320, 400 is exposed is mainly the supplied gas. Therefore, in the absence of bubble formation, gas dissolves into the immersion liquid at the meniscus 320, 400. Over time the concentration of the supplied gas may increase. Liquid at the meniscus is consequently affected most by the supplied gas. The increased concentration of the supplied gas may affect optical properties of the immersion liquid, for example its refractive index. However, continual extraction of liquid from the space 11 at the meniscus helps prevent the liquid radially inward of the meniscus from being substantially affected by the increased concentration of the gas.

However, any bubble which is formed at the meniscus, for example on collision with a droplet, is likely to include a gas bubble at least largely of the supplied gas. The bubble, as it contains the supplied gas, readily dissolves in the immersion liquid, beyond the region of extraction of, for example, outlet 14 or openings 50. Because the bubble desirably dissolves before it reaches the image field 130, i.e. the path of the projection beam through the space 11, most of the gas of the bubble dissolves in the immersion liquid before it reaches the image field 130. Since most of the liquid in the path of the bubble is extracted near the meniscus, it is likely that the liquid in which the supplied gas is dissolved, is extracted before it significantly affects the optical properties of the immersion liquid in the space.

By using gaseous $CO_2$ the problem associated with the meniscus 320 colliding with a droplet of liquid may be reduced, if not alleviated. Typically a droplet of 300 micrometers would produce a bubble of 30 micrometers in diameter (i.e. a tenth the size). Such a bubble of carbon dioxide would usually dissolve in the immersion liquid before reaching the exposure area. (Note that a droplet of such a size may cause one or more other problems). Therefore the problems caused by a droplet would be less significant. The immersion system would be more tolerant of interacting with immersion liquid which had escaped from the space.

When the gas supplying system is applied in combination with the bubble deflection system as described (i.e. the liquid confinement member provided with a continuous, elongate liquid supply opening arranged to direct liquid toward the substrate), the amount of liquid supply through the elongated liquid supply opening used to deflect critical bubbles may be reduced. Phrased differently, less liquid may need to be supplied via the elongated liquid supply opening to deflect critical bubbles, in case a gas supplying system is used, the gas supplying system providing a gas with high solubility in immersion liquid in an area near a meniscus of the confined liquid.

In an embodiment, there is provided a lithographic apparatus comprising: a substrate table arranged to hold a substrate and scan the substrate in a scanning direction; a projection system arranged to project an image onto the substrate whilst the substrate is scanned by the substrate table; and a liquid confinement system arranged to confine a liquid to a space between the projection system and the substrate; wherein the projection system has an optical axis and is arranged to project the image into an image field having a maximum dimension in a direction perpendicular to the optical axis and the scanning direction that is smaller than a maximum dimension of the space in the direction; and the liquid confinement system has a liquid confinement member bordering the space, the liquid confinement member defining a continuous, elongate liquid supply opening arranged to direct liquid toward the substrate, the elongate liquid supply opening having a dimension in the direction that is greater than the maximum dimension of the image field and less than the maximum dimension of the space.

The liquid confinement system may further define a plurality of further liquid supply openings, the further liquid supply openings being arranged in at least one line and having a maximum dimension that is small compared to the maximum dimension of the elongate liquid supply opening. The liquid confinement member may further define a second elongate liquid supply opening on the other side of the space from the elongate liquid supply opening. In an embodiment the elongate liquid supply opening is V-shaped or curved. The liquid confinement system may further comprise a liquid supply arranged to supply liquid to the space and a rate equal to or greater than about 1 l/min; equal to or greater than about 1.25 l/min, equal to or greater than about 1.5 l/min or equal to or greater than about 2 l/min. In an embodiment, the elongate liquid supply opening has a width of less than or equal to about 100 µm, less than or equal to about 70 µm, less than or equal to about 50 µm, less than or equal to about 30 µm, or less than or equal to about 20 µm. In an embodiment, the liquid confinement member has a facing surface which defines the elongate liquid supply opening. In such embodiment, the facing surface is positioned, during operation of the apparatus, a distance from the substrate is less than or equal to about 200 µm, less than or equal to about 180 µm, or less than or equal to about 150 µm. In an embodiment, the apparatus may further comprise: a gas supplying device configured to supply gas with a solubility in the immersion liquid of greater than $5\times10^{-3}$ mol/kg at 20° C. and 1 atm total pressure to a region adjacent the space. In such embodiment, the gas supplying device may comprise a source of gas with a solubility in immersion liquid of greater than $5\times10^{-3}$ mol/kg at 20° C. and 1 atm total pressure.

In an embodiment, there may be provided an immersion lithographic apparatus for projecting an image onto a substrate through a body of liquid confined on a surface of the substrate by a liquid confinement system, whilst the substrate is scanned in a scanning direction; wherein the liquid confinement system has an elongate liquid supply opening arranged to create a region of relatively high shear and pressure gradient in the body of liquid so as to divert bubbles of gas in the liquid away from the image.

In such an apparatus, the elongate liquid supply opening may have a width in the range of from 20 µm to 30 µm. The liquid confinement system may comprise a liquid confinement member having a surface that in use faces the substrates and a positioning system 600 configured to position the liquid confinement member so that the surface is a predetermined distance from the substrate, wherein the liquid supply opening is formed in the surface and the predetermined distance is in the range of from about 120 µm to about 180 µm. The liquid confinement system may further comprise a liquid supply configured to supply liquid to flow out of the liquid supply opening at a rate of from about 1.25 l/min to about 2.0 l/min.

In an embodiment, the apparatus may further comprise: a fluid handling system configured to confine immersion liquid to a localized space between a final element of a projection system and a substrate and/or table; and a gas supplying device configured to supply gas with a solubility in the immersion liquid of greater than $5\times10^{-3}$ mol/kg at 20° C. and 1 atm total pressure to a region adjacent the space. In such embodiment, the gas supplying device may comprise a source of gas with a solubility in immersion liquid of greater than $5\times10^{-3}$ mol/kg at 20° C. and 1 atm total pressure.

In an embodiment, there may be provided a device manufacturing method using a lithographic apparatus, the method comprising: confining a body of liquid to a space in contact with the surface of a substrate; projecting an image onto the substrate through the body of liquid whilst moving the substrate in a scanning direction; forming an elongate region of relatively high pressure in the body of liquid ahead of the image in the scanning direction whereby the region of relatively high pressure is effective to divert bubbles of gas in the body of liquid away from the image.

In an embodiment of such method, the region of high pressure is effective to direct bubbles having a size greater than or equal to about 30 µm, greater than or equal to about 20 µm, greater than or equal to about 15 µm, or greater than or equal to about 12 µm. In such method, the substrate may have a contact angle to the liquid that is greater than or equal to about 90°, greater than or equal to about 100°, or greater than or equal to about 110°. The substrate may also have a hysteresis of contact angle to the liquid of less than or equal to about 20°, less than or equal to about 15°, or less than or equal to about 10°. In an embodiment, the forming comprises supplying liquid through an elongate opening in a surface of a liquid confinement structure, the distance between the surface and the substrate being in the range of from about 120 µm to about 180 µm. In an embodiment, the forming comprises supplying liquid through an elongate opening having a width in the range of from about 20 µm to about 30 µm. In an embodiment, the forming comprises supplying liquid at a rate of from about 1.25 l/m to 2.0 l/m. In an embodiment, the method further comprises: providing to a region adjacent to the space a gas with a solubility in the immersion liquid of greater than $5\times10^{-3}$ mol/kg at 20° C. and 1 atm total pressure. In an embodiment, the method further comprises: providing to a region adjacent to the space a gas with a product of diffusivity and solubility in the immersion liquid of greater than that of air at 20° C. and 1 atm total pressure.

In an embodiment, there is provided an immersion lithographic apparatus for projecting an image onto a substrate through a body of liquid confined on a surface of the substrate by a liquid confinement system, whilst the substrate is scanned in a scanning direction; wherein the liquid confinement system has a liquid confinement member that defines a plurality of liquid supply openings in a surface facing the substrate, the plurality of liquid supply openings including openings of at least two different lengths.

In an embodiment, there is provided an immersion lithographic apparatus for projecting an image onto a substrate through a body of liquid confined on a surface of the substrate by a liquid confinement system, whilst the substrate is scanned in a scanning direction; wherein the liquid confinement system has a liquid confinement member that has at least one corner aligned with the scanning direction and that defines an elongate liquid supply opening in a surface facing the substrate, the elongate liquid supply opening being located at the corner.

In an embodiment, there is provided an immersion lithographic apparatus for projecting an image onto an image filed on a substrate through a body of liquid confined on a surface of the substrate by a liquid confinement system, whilst the substrate is scanned in a scanning direction; wherein the liquid confinement system has a liquid confinement member has a surface facing the substrate, an elongate liquid supply opening defined in the surface and positioned in the scanning direction in front of the image field.

In an embodiment, there is provided a liquid confinement system arranged to confine a liquid to a space between a projection system and a facing surface being a substrate and/or a table configured to support the substrate comprising a liquid confinement member bordering the space, the projection system having an optical axis and being arranged to project an image into an image field having a maximum dimension in a direction perpendicular to the optical axis and the scanning direction that is smaller than a maximum dimension of the space in the direction, the liquid confinement member defining a continuous, elongate liquid supply opening arranged to direct liquid toward the facing surface, the elongate liquid supply opening having a dimension in the direction that is greater than the maximum dimension of the image field and less than the maximum dimension of the space.

In an embodiment, there is provided a liquid confinement system for an immersion lithographic apparatus, the liquid confinement system configured to confine immersion liquid on a surface of a substrate while the substrate is scanned in a scanning direction, wherein the liquid confinement system has an elongate liquid supply opening arranged to create a region of relatively high shear and pressure gradient in the liquid so as to divert a bubble of gas in the liquid away from an image projected onto the substrate through the liquid.

In an embodiment, there is provided a liquid confinement system for an immersion lithographic apparatus, the liquid confinement system configured to confine immersion liquid on a surface of a substrate and having a liquid confinement member comprising a plurality of liquid supply openings formed in a surface facing the substrate, the plurality of liquid supply openings including openings of at least two different lengths.

In an embodiment, there is provided a liquid confinement system for an immersion lithographic apparatus, the liquid confinement system configured to confine immersion liquid on a surface of a substrate and having a liquid confinement member that has at least one corner aligned with a scanning direction in which the substrate is scanned and comprising an elongate liquid supply opening formed in the surface, the elongate liquid supply opening being located at the corner.

In an embodiment, there is provided a liquid confinement system for an immersion lithographic apparatus, the liquid confinement system configured to confine immersion liquid on a surface of a substrate and having a liquid confinement member comprising a facing surface facing the substrate, an elongate liquid supply opening formed in the surface and positioned in a scanning direction in which the substrate is scanned, in front of an image field projected onto the surface of the substrate.

The liquid confinement system of the embodiments as described may further comprise a fluid handling system configured to confine immersion liquid to a localized space between a final element of a projection system and a substrate and/or table; and a gas supplying device configured to supply gas with a solubility in the immersion liquid of greater than $5\times10^{-3}$ mol/kg at 20° C. and 1 atm total pressure to a region adjacent the space. In such embodiment, the gas supplying device may comprise a source of gas with a solubility in immersion liquid of greater than $5\times10^{-3}$ mol/kg at 20° C. and 1 atm total pressure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media. The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a substrate table arranged to hold a substrate and scan the substrate in a scanning direction;
   a projection system arranged to project a radiation beam onto the substrate while the substrate is scanned by the substrate table; and
   a liquid confinement system arranged to confine a liquid to a space between the projection system and the substrate; and
   a liquid supply opening configured to supply the liquid to the space, wherein
   the projection system has an optical axis and is arranged to project the radiation beam into an image field having a maximum cross-wise dimension, in a direction perpendicular to the optical axis and the scanning direction, that is smaller than a maximum cross-wise dimension, in the direction, of a portion of the space containing the liquid,
   the liquid confinement system has a liquid confinement member bordering the portion of the space containing the liquid, the liquid confinement member having a liquid supply orifice defined in a surface thereof, the liquid supply orifice having a continuous, elongate cross-section in the surface that does not surround the optical axis and is separate from the liquid supply opening, the liquid supply orifice arranged to direct the liquid toward the substrate and the elongate cross-section having a cross-wise dimension in the direction that is greater than the maximum cross-wise dimension of the image field and less than a maximum cross-wise dimension, in the direction, of the portion containing the liquid,
   the liquid confinement system is configured to provide the liquid from the liquid supply orifice at a higher pressure than that of the liquid in the portion of the space containing the liquid,
   the liquid confinement member defines an open aperture through which the radiation beam is arranged to pass and through which the liquid from the liquid supply opening is arranged to pass from above the aperture to below the aperture, and
   the liquid confinement member comprises an exhaust orifice defined in an exterior surface of the liquid confinement member, the exhaust orifice located outward, relative to a path of the radiation beam through the space, of the liquid supply orifice and a cross-section of the exhaust orifice facing toward the substrate table, the exhaust orifice configured to remove at least part of the liquid supplied from the liquid supply opening.

2. The lithographic apparatus according to claim 1, wherein the liquid confinement system has a plurality of further liquid supply openings, the further liquid supply openings arranged in at least one line and having a maximum dimension of its respective cross-section that is small compared to the dimension of the elongate cross-section.

3. The lithographic apparatus according to claim 1, wherein the liquid confinement member further comprises a second elongate liquid supply orifice on the other side of the image field from the liquid supply orifice.

4. The lithographic apparatus according to claim 1, wherein the elongate cross-section is V-shaped.

5. The lithographic apparatus according to claim 1, wherein the elongate cross-section is curved.

6. The lithographic apparatus according to claim 1, wherein the liquid confinement system further comprises a liquid supply arranged to supply the liquid to the space at a rate equal to or greater than about 1 l/min.

7. The lithographic apparatus according to claim 1, wherein the elongate cross-section has a width of less than or equal to about 100 μm.

8. The lithographic apparatus according to claim 1, wherein the surface of the liquid confinement member faces the substrate.

9. The lithographic apparatus according to claim 8, wherein the surface is positioned, during operation of the apparatus, a distance from the substrate that is less than or equal to about 200 μm.

10. An immersion lithographic apparatus configured to project a radiation beam, using a projection system, onto a substrate through an image field and a body of liquid confined on a surface of the substrate by a liquid confinement system, while the substrate is scanned in a scanning direction, wherein the image field has a maximum cross-wise dimension in a direction perpendicular to the scanning direction and an optical axis of the projection system and the liquid confinement system comprises:
   a first liquid supply opening to supply the liquid to the body, the liquid from the first liquid supply opening passing from above an open aperture of a liquid confinement member to below the aperture,
   a second liquid supply opening arranged to create a region of higher pressure within and away from an outer boundary of the body of liquid supplied by the first liquid supply opening, so as to divert bubbles of gas in the liquid away from the radiation beam, the second liquid supply opening having a continuous, elongate cross-section defined in an exterior surface of the liquid confinement member, the elongate cross-section not surrounding the image field and the second liquid supply opening forming the region of higher pressure with a maximum cross-wise dimension in the direction that is greater than the maximum cross-wise dimension of the image field, and
   an exhaust orifice defined in an outer surface of the liquid confinement member, the exhaust orifice located outward, relative to a path of the radiation beam through the space, of the second liquid supply opening and a cross-section of the exhaust orifice facing toward the substrate, the exhaust orifice configured to remove at least part of the liquid supplied from the first liquid supply opening.

11. The lithographic apparatus according to claim 10, wherein the exterior surface in use faces the substrate and further comprising a positioning system configured to position the liquid confinement member, the substrate, or both, so that the exterior surface is a certain distance from the substrate, wherein the distance from the substrate is selected from the range of from about 120 μm to about 180 μm.

12. The lithographic apparatus according to claim 10, wherein the liquid confinement system further comprises a liquid supply configured to supply the liquid to flow out of the second liquid supply opening at a rate of from about 1.25 l/min to about 2.0 l/min.

13. A device manufacturing method using a lithographic apparatus, the method comprising:
    providing a liquid using a liquid supply opening, the liquid from the liquid supply opening passing from above an open aperture of a liquid confinement member to below the aperture;
    at least partly confining a body of the liquid to a space in contact with a surface of a substrate using the liquid confinement member;
    projecting, using a projection system, a radiation beam through the aperture, through an image field, through the body of liquid and onto the substrate while moving the substrate in a scanning direction, the image field having a maximum cross-wise dimension in a direction perpendicular to the scanning direction and an optical axis of the projection system;
    forming a continuous elongate region of higher pressure within and away from an outer boundary of the body of liquid ahead of the radiation beam in the scanning direction whereby the elongate region of higher pressure is effective to divert bubbles of gas in the body of liquid away from the radiation beam, wherein the elongate region is formed by a further liquid supply opening, has a maximum cross-wise dimension in the direction that is greater than the maximum cross-wise dimension of the image field and does not surround the image field; and
    removing at least part of the liquid supplied from the liquid supply opening using an exhaust orifice defined in an exterior surface of the liquid confinement member, wherein the exhaust orifice is located outward, relative to a path of the radiation beam through the space, of the further liquid supply opening and a cross-section of the exhaust orifice faces toward the substrate.

14. The method according to claim 13, wherein the region of higher pressure is effective to direct bubbles having a size greater than or equal to about 12 μm.

15. The method according to claim 13, wherein the substrate has a contact angle to the liquid that is greater than or equal to about 90°.

16. The method according to claim 13, wherein the substrate has a hysteresis of contact angle to the liquid of less than or equal to about 20°.

17. The method according to claim 13, wherein the forming comprises supplying the liquid through the further liquid supply opening in a surface of the liquid confinement member, the distance between the surface and the substrate being selected from the range of from about 120 μm to about 180 μm.

18. The method according to claim 13, wherein the further liquid supply opening has a cross-sectional width selected from the range of from about 20 μm to about 30 μm and/or wherein the forming comprises supplying the liquid at a rate of from about 1.25 l/min to 2.0 l/min.

19. An immersion lithographic apparatus to project an image onto a substrate through a body of liquid confined on a surface of the substrate by a liquid confinement system, while the substrate is scanned in a scanning direction that is orthogonal to a stepping direction of movement of the substrate, wherein the liquid confinement system has a liquid confinement member that has a liquid supply orifice defined in a surface thereof facing the substrate, the orifice comprising a continuous cross-section in the liquid confinement member surface that is elongate, is generally V-shaped, has a straight portion, and does not surround the image.

20. The lithographic apparatus according to claim 19, wherein an image field associated with the image has a maximum cross-wise dimension in the stepping or scanning direction and the elongate cross-section has a cross-wise dimension in the respective stepping or scanning direction that is greater than to the maximum cross-wise dimension of the image field.

* * * * *